(12) United States Patent
Liu et al.

(10) Patent No.: US 10,024,897 B2
(45) Date of Patent: Jul. 17, 2018

(54) MOBILE ELECTRIC FIELD SENSOR BASED PHASOR MEASUREMENT UNIT FOR MONITORING AN ELECTRIC POWER GRID

(71) Applicant: University of Tennessee Research Foundation, Knoxville, TN (US)

(72) Inventors: Yilu Liu, Knoxville, TN (US);
Wenxuan Yao, Knoxville, TN (US);
Lingwei Zhan, Knoxville, TN (US);
Wei Gao, Knoxville, TN (US);
Haoyang Lu, Knoxville, TN (US)

(73) Assignee: UNIVERSITY OF TENNESSEE RESEARCH FOUNDATION, Knoxville, TN (US)

( * ) Notice: Subject to any disclaimer, the term of this patent is extended or adjusted under 35 U.S.C. 154(b) by 1023 days.

(21) Appl. No.: 14/340,120

(22) Filed: Jul. 24, 2014

(65) Prior Publication Data

US 2016/0025785 A1   Jan. 28, 2016

(51) Int. Cl.
| G01R 13/00 | (2006.01) |
| G01R 25/00 | (2006.01) |
| G01R 19/25 | (2006.01) |
| G01R 29/12 | (2006.01) |
| G01R 23/02 | (2006.01) |

(52) U.S. Cl.
CPC ......... *G01R 25/00* (2013.01); *G01R 19/2513* (2013.01); *G01R 29/12* (2013.01); *G01R 23/02* (2013.01); *Y02E 60/728* (2013.01); *Y04S 10/265* (2013.01)

(58) Field of Classification Search
CPC .... G01R 19/2513; G01R 23/02; G01R 25/00; G01R 29/12; Y02E 60/728; Y04S 10/265
See application file for complete search history.

(56) References Cited

U.S. PATENT DOCUMENTS

| 5,210,407 A * | 5/1993 | Ito ................. G01R 29/0885 250/227.11 |
| 7,683,798 B2 * | 3/2010 | Rostron ................. G01R 1/04 324/117 H |
| 2009/0284249 A1* | 11/2009 | Syracuse .............. G01R 15/142 324/126 |
| 2010/0250168 A1* | 9/2010 | Zhang ................ G01R 19/2513 702/70 |
| 2012/0016538 A1* | 1/2012 | Waite ..................... G01C 21/20 701/3 |

* cited by examiner

*Primary Examiner* — David M Gray
*Assistant Examiner* — Geoffrey T Evans
(74) *Attorney, Agent, or Firm* — Hunton Andrews Kurth LLP (57) ABSTRACT

A system may include an electric field sensor, an analog to digital converter, and an estimator. The electric field sensor may measure electric fields of electric power grid. The analog to digital converter may generate digital output based upon measurements from the electric field sensor. The estimator may estimate phasor data of the electric power grid based upon the digital output.

38 Claims, 5 Drawing Sheets

MOBILE ELECTRIC FIELD SENSOR BASED PHASOR MEASUREMENT UNIT FOR MONITORING AN ELECTRIC POWER GRID

STATEMENT REGARDING FEDERALLY SPONSORED RESEARCH OR DEVELOPMENT

This invention was made with government support from the Engineering Research Center Program of the National Science Foundation and DOE under NSF Award Number EEC-1041877 and the CURENT Industry Partnership Program. The U.S. Government has certain rights in this invention.

BACKGROUND

Wide-area measurement systems (WAMS) have made possible the monitoring of overall bulk power systems as well as provided insights into system dynamics. Phasor measurement units (PMU) have been deployed in many points of a power grid system to measure phasor parameters, such as frequency, amplitude and angle of the electrical supply in a 3-phased alternating current (AC) electric power grid. A type of single-phase Phasor Measurement Unit (PMU) known as a Frequency Disturbance Recorder (FDR) may be used for amplitude, angle, and frequency measurements at a typical distribution level electric outlet. Typical PMUs and FDRs require direct electrical contacts with the power lines to sense the electric signals, making the setup process for the PMUs and the FDRs relatively complex and costly. PMUs may employ current transformers physically connected to the transmission line, transformers or bus to obtain current signals/information, and potential transformers physically connected to the transmission line, transformers to obtain voltage information for synchrophasor measurement. However, the physically connection of PMUs results in high installation and maintenance costs. The high installation and maintenance costs limited installation and widespread use of PMUs. In addition, PMUs may be deployed in substations to monitor electric power systems, so they have low accessibility and portability. In remote areas, it may be difficult and inconvenient to set up a PMU or FDR, which may be typically bulky and expensive. The low accessibility and low portability limits the deployment locations of PMUs in wide-area electric systems.

Therefore, there may be a need for a portable inexpensive type of PMU/FDR systems that can function in remote locations without significant performance degradation or complex setup processes.

DETAILED DESCRIPTION

Figure 1:
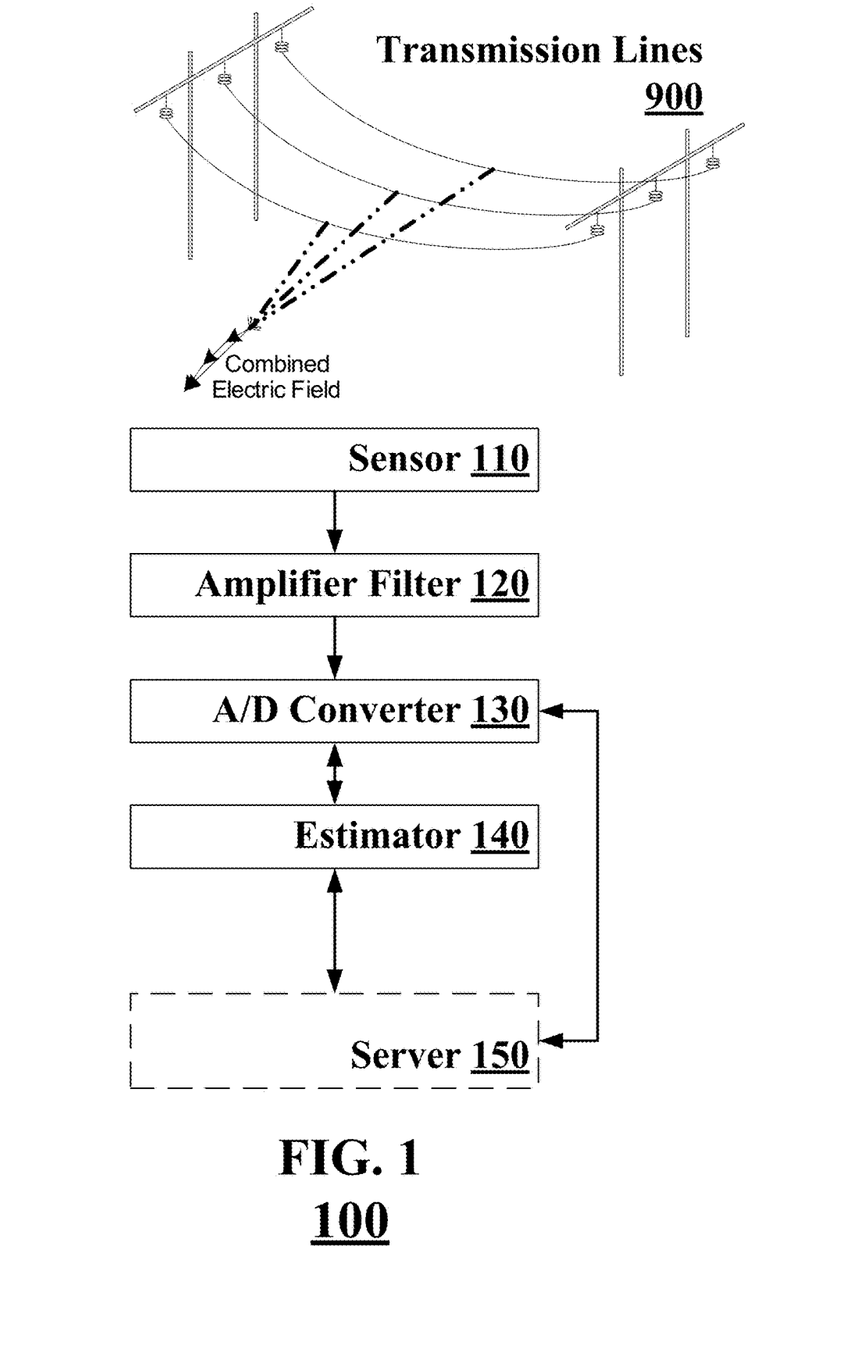
FIG. 1 illustrates a system according to an embodiment of the present disclosure.

FIG. 1 illustrates a real-time PMU system 100 for monitoring and situational awareness of electric power systems according to an embodiment.

A PMU may be a device which measures the phasor of specific location points of an electricity grid, using a common time index for synchronization. Time synchronization allows synchronized real-time measurements of multiple remote measurement points on the grid. Synchronized phasor (Synchrophasor) measurement may be one of the key elements of wide area measurement systems (WAMS) in advanced power system monitoring, protection, and control applications. Synchrophasor measurements can provide a unique capability to monitor system dynamics in wide area and in real-time, as well as the possibility of controlling and protecting the electric power system.

According to an embodiment of FIG. 1, the system 100 may include a sensor 110, an amplifier filter 120, an analog-to-digital (A/D) converter 130, and an estimator 140. The system 100 may be implemented on a mobile communication device, such as a cell phone or a satellite phone, by augmenting the mobile device with additional components, such that the microprocessor of the mobile device may be used to control the various components of system 100 and perform various calculations. For example, the estimator 140 may be implemented on the mobile device, and the sensor 110, the amplifier filter 120, and the A/D converter 130 may be connected to the estimator 140 on the mobile device.

The sensor 110 may be placed near a set of power grid equipment (such as power transmission lines) 900 without directly contacting them, and may include an electric field transducer, which measures by transduction an electric field characteristic of a voltage carrying element such as transmission line at a specific location point in an electrical power system, and generates at least one signal representative of the electric supply at the specific point. For a 3-phase power transmission lines for example, the combined electric field of the transmission lines may add up as an electric field of varying strength and polarity (sinusoidal in waveform) at the sensor 110. The amplifier filter 120 may amplify and filter the signal from the sensor 110. The A/D converter 130 may convert the signal into digital form. The estimator 140 may calculate/estimate the phasor data, such as phase angle and frequency, of the electric power grid at the specific point in the electric system.

The system 100 may optionally include a server 150, designed to receive and store phasor data, such as phase angle and frequency, estimated from one or more remote locations, simultaneously or otherwise.

The A/D converter 130 may be controlled by a microprocessor of a mobile device to generate the digital output signal. The A/D converter 130 may be connected to the mobile device through Universal Serial Bus (USB) connectors. Mobile local time may be calibrated by Network Time Protocol (NTP) using the mobile device's communication link with the server 150, or a communication network of a wireless/cellular service. Alternatively, Global Positioning System (GPS) signals may be used to provide a synchronized local time. The local time may be used as synchronization signal to control the A/D converter 130.

The estimator 140 may be a separate dedicated processor that calculates/estimates phasor data, or a phasor estimation algorithm may be implemented on the microprocessor of the mobile device to calculate phasor data, such as phase angle and frequency. The phasor data may be transmitted over any wireless network for system and/or saved locally on the mobile device, using NTP synchronized time as global timestamp for the phasor data.

The electrical characteristics of the specific point of a transmission line may be determined without physical connection to transmission line by using measurement from the electric field generated by the transmission line, known as transduction. The transmission line produces an electric field between the line itself and the ground. The frequency of the varying electric field corresponds to the frequency of the voltage signal in the transmission line.

An electric field transducer with free-body type sensor may measure the charging current in between the two halves of isolated conductive bodies. The free-body type sensor refers to sensors that include two conductive plates (isolated conductive bodies) with an insulation layer (or vacuum) between them. Larger sized isolated conductive bodies may produce stronger measurement signals. Consequently, it may be desirable to design and construct an electric field transducer sufficiently large to maximize measurement signal strength. On the other hand, to make the PMU mobile and portable, the size of electric field transducer may need to be as small as possible. An exemplary sensor 110 may include a printed circuit board (PCB) that has two layers of parallel copper plates. The PCB, for example, may have copper plates of each 5.05 cm in length, 3.05 cm in width, (~15 cm$^2$ in area), and 0.75 cm in thickness between the two parallel copper plates.

The analog output signal from the sensor 110 may be directly converted to a digital signal via A/D converter 130. However, the overall resolution and accuracy of digital signal may be significantly improved as the magnitude of the input signal to A/D converter 130 reaches the maximum input range of the A/D converter 130. For this reason, it may be desirable to amplify the signal generated by sensor 110.

The amplifier filter 120 may use ultra-precision operational amplifier (Op Amp) to amplify the output signal generated by electric field transducer. The amplifier filter 120 may have multi-stage amplification circuits to achieve desired amplification. The amplifier filter 120 may include analog low pass filter to filter noise in the signal, at the output end of the amplifier filter 120.

Figure 2:
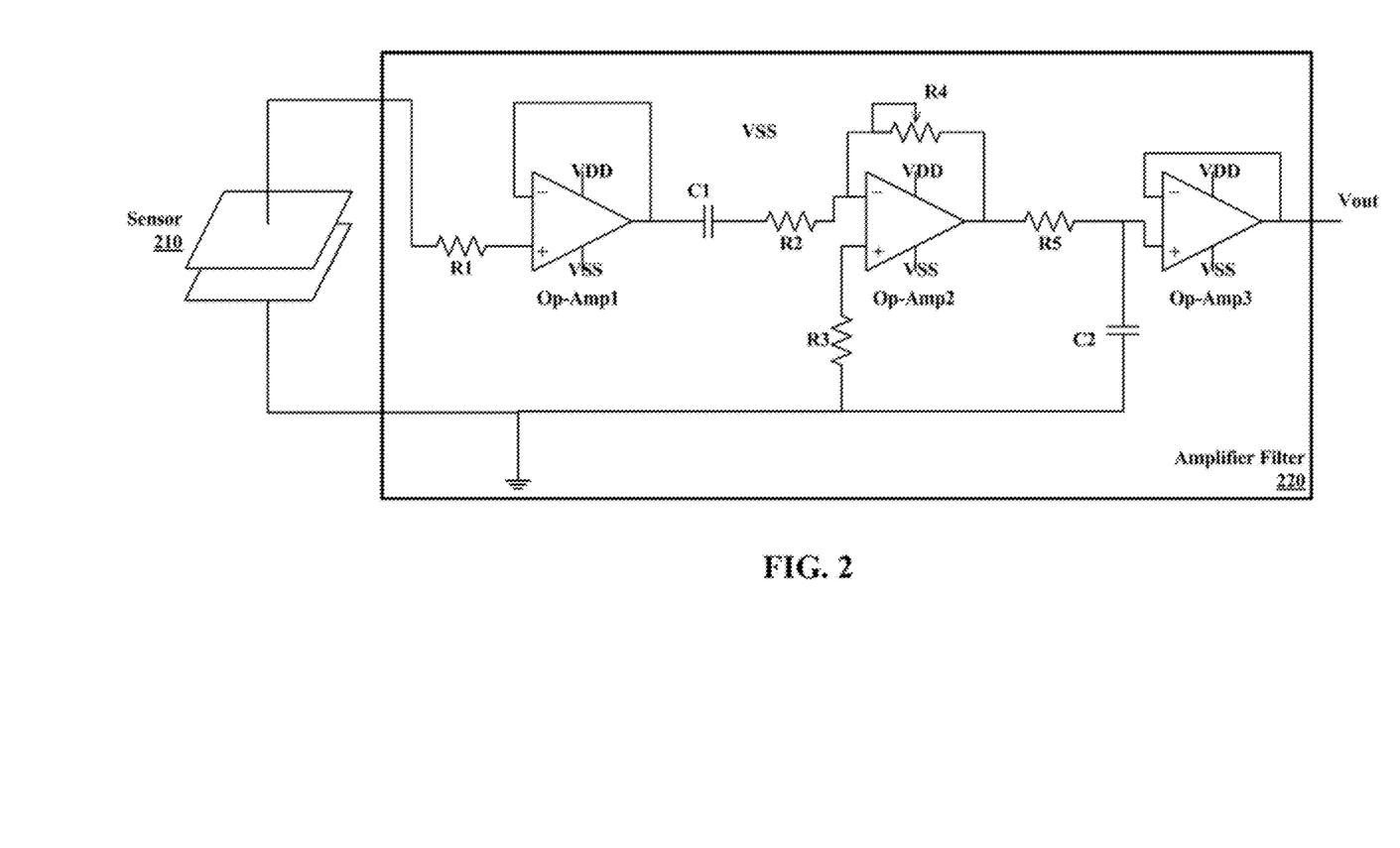
FIG. 2 illustrates a portion of the system according to an embodiment of the present disclosure.

FIG. 2 illustrates a portion of the system according to an embodiment of the present disclosure, including the sensor 210 and the amplifier filter 220.

According to an embodiment as illustrated in FIG. 2, sensor 110 may be an electric field sensor that includes two isolated conductive bodies, with one body connected to ground (GND), and another body connected as input to the amplifier filter 220. The amplifier filter 220 may include 3 operation amplifiers (Op-Amp), Op-Amp1 through Op-Amp3. Each Op-amp may be for example, an Op-Amp OP177 from Analog Devices, Inc of Norwood, Mass. Op-Amp1 may be connected to resistor R1 and capacitor C1 to provide as a high input impedance stage. Op-Amp2 may be connected to resistors R2, R3, and R4 to provide as an amplifier stage. Op-Amp3 may be connected to resistors R5 and C2 to provide as a low pass filter stage.

R1 may be a 1 Kiloohm (KΩ) resistor which may be electrically connected as input to Op-Amp1. A C1 of 0.1 microFarad (μF) capacitance and a R2 of 1 KΩ resistance may be used to connect between the output of Op-Amp1 and the input of Op-Amp2. C1 may be used to block any direct current (DC) components in the measured signals. Op-Amp2 may be connected with a 1 KΩ resistor R3 and an adjustable resistor R4 with maximum value 500 KΩ to allow adjustment of the range of gain for the different voltage level of transmission line. Thus here, the amplifier filter 220 may provide a maximum gain ratio of 500. The Op-Amp3 may be connected to a 806Ω resistor R5 and a 1 μF capacitor C2 to provide as a low pass filter with a cutoff frequency of 197 Hz. The output signal Vout may be connected to the input of the A/D converter 130.

Further referring to the PMU system 100 in FIG. 1, the A/D converter 130 may convert analog output signal from the amplifier filter 120 to digital signal. Internal A/D converter in a microcontroller may be used for analog to digital signal data conversion. An exemplary microcontroller may be for example, a ATmega328. It has an internal 10-bit A/D converter. However, the greater resolution of A/D conversion, the greater accuracy of phasor data becomes. Thus, additional external A/D converters may be used with a microcontroller to provide additional bits for higher A/D conversion resolution.

A microcontroller may control the A/D converter 130's sampling rate, and may receive the digital data from A/D converter 130. The digital data may be transmitted to the mobile device via USB connection, such as through a USB host controller IC MAX3421E. The MAX3421E host controller implements a full-speed host compliant to USB specification v2.0. The mobile device may send the sampling command to the A/D converter 130.

The microcontroller may be a part of the A/D converter 130. The microcontroller may control the A/D converter 130 using firmware/hardware, or may be implemented with a processor performing the calculations according to a set of computer program codes from a non-transitory computer-readable storage medium.

Network Time Protocol (NTP) may provide timestamp data for phasor data and may provide synchronization signal for the A/D converter 130. The Coordinated Universal Time (UTC) timestamp may be retrieved by requesting a NTP server every 2 second. The received NTP timing information coordinates local time of mobile PMU system 100 to calculate the local time and globally synchronized timestamp.

Figure 3:
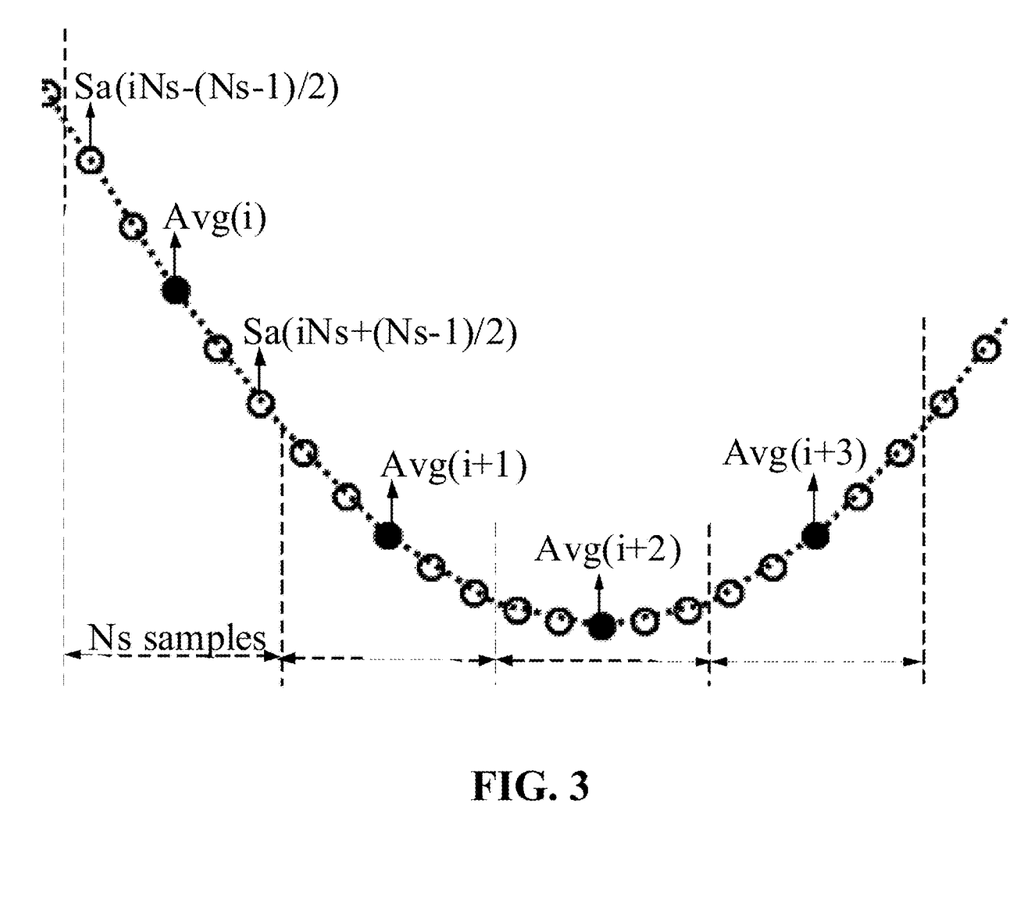
FIG. 3 illustrates a digital sampling of a signal in a timing diagram according to an embodiment of the present disclosure.

FIG. 3 illustrates a digital sampling of a signal in a timing diagram according to an embodiment of the present disclosure.

Synchronized and time stamped digital data may be transmitted to the estimator 140 for processing in phasor estimation algorithm on the mobile PMU system 100. Digital data may be processed in the estimator 140 with digital filter to reduce the noise and harmonics of the digital signal. Digital averaging filter may be implemented by oversampling the analog signal at the A/D converter 130 and then averaging the sequence of digital samples to reduce the noise in signal, as illustrated in FIG. 3. The equation used for realizing filter may be shown in Equation (1) below.

$$Avg(i) = \frac{\sum_{j=i \times Ns-(Ns-1)/2}^{i \times Ns+(Ns-1)/2} Sa(j)}{Ns} (i \geq 0) \quad (1)$$

where Avg(i) may be the sample data of filtered signal, and Sa(j) may be the sample data of input signal. Avg(i) may be calculated by averaging $N_s$ samples from Sa(i×Ns−(Ns−1)/2) to Sa(i×Ns+(Ns−1)/2). Generally, the noise can be better filtered with higher value of Ns. However, a larger Ns requires a higher sampling rate, which increases the hardware and computation burden. As a result, a balance needs to be struck between filter performance and hardware burden. An exemplary Ns may be set to 15.

In addition, digital band-pass filter that has a central frequency close to nominal frequency can also reduce the noise in the signal, results in accuracy improvement of phasor data.

Figure 4:
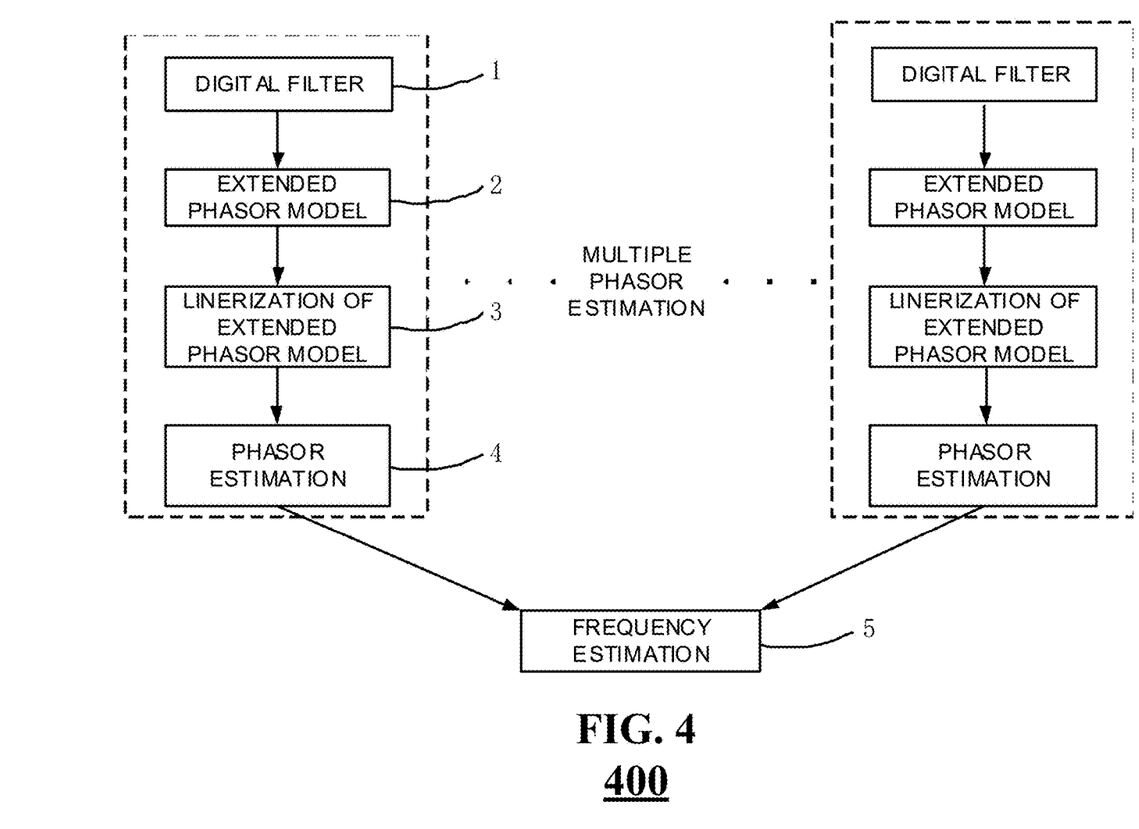
FIG. 4 illustrates a phasor estimation process according to an embodiment of the present disclosure.

FIG. 4 illustrates a phasor estimation process 400 according to an embodiment of the present disclosure. The phasor estimation process 400 may be implemented as on a firmware/hardware level, or may be implemented in a processor performing the calculations according to a set of computer program codes from a non-transitory computer-readable storage medium.

The phasor of filtered digital signal may be calculated by phasor estimation algorithm shown in FIG. 4. The filtered digital signal may be fitted to extended phasor model that includes both fundamental and multiple harmonics components. Equation (2) represents the extended phasor model includes harmonics.

$$s(t)=A_0(t)\cos(2\pi f_0 t+\varphi_0(t))+\Sigma_{i=2}^{\infty}A_i(t)\cos(2\pi i f_0 t+\varphi_i(t)) \quad (2)$$

An exemplary of the extended phasor model may be to model fundamental frequency component, $2^{nd}$ and $3^{rd}$ order harmonics components of the digital signal as shown in Equation (3).

$$s(t)=A_0(t)\cos(2\pi f_0 t \varphi_0(t))+\Sigma_{i=2}^{3}A_i(t)\cos(2\pi i f_0 t \varphi_i(t)) \quad (3)$$

Compared to other higher harmonics components, $2^{nd}$ order and $3^{rd}$ order harmonics causes greater estimation error of phasor data. As a result, including $2^{nd}$ order and $3^{rd}$ order harmonics component in phasor model may significantly compensate for the errors and improve the estimation accuracy of phasor data.

The phasor model may be linearized using polynomial for estimation. Quadratic polynomial equations may be accurate enough to linearize the fundamental component of the digital signal, and linear polynomial may be appropriate to linearize $2^{nd}$ order and $3^{rd}$ order harmonic component. As a result, the linearized phasor model may be represented by $$s(t) = \frac{1}{2}(P(t)e^{j2\pi f_0 t} + \overline{P}(t)e^{-j2\pi f_0 t}) + \sum_{i=2}^{3}\frac{1}{2}(Q_i(t)e^{j2\pi i f_0 t} + \overline{Q}_i(t)e^{-j2\pi i f_0 t}) \quad (4)$$

where $$P(t)=A_0(t)e^{j\varphi_0(t)}\approx p_0+p_1 t+p_2 t^2$$

$$Q_i(t)=A_i(t)e^{j\varphi_i(t)}\approx q_{i0}+q_{i1}t$$

$f_0$ may be the nominal frequency; $\overline{P}(t)$ and $\overline{Q}_i$ may be complex conjugates of $P(t)$ and $Q_i(t)$, respectively.

Then, sequential samples of the digital data may be fitted to the linearized phasor model to obtain the following equation $$S=BM \quad (5)$$

where $S=[s(-N_h), \ldots, s(0), \ldots, s(N_h)]'$
$s(j)$ $(j=-N_h, \ldots, N_h)$ may be the value of jth sample of digital input signal.

$$M=[\overline{p_2},\overline{p_1},\overline{p_0},\overline{q_{21}},\overline{q_{20}},\overline{q_{31}},\overline{q_{30}},q_{30},q_{31},q_{20},q_{21},p_0,p_1,p_2]'$$

M may be a matrix constructed with the coefficients of the quadratic polynomial and linear polynomial.

B corresponds to the relationship between S and M.

$$M = (M_1, M_2, M_3, M_4, M_5, M_6)$$

$$M_1 = \begin{pmatrix} (-N_h)^2 e^{jN_h\omega_1} & (-N_h)^1 e^{jN_h\omega_1} & (-N_h)^0 e^{jN_h\omega_1} \\ \cdots & \cdots & \cdots \\ (-n)^2 e^{jn\omega_1} & (-n)^1 e^{jn\omega_1} & (-n)^0 e^{jn\omega_1} \\ \cdots & \cdots & \cdots \\ 0 & 0 & 1 \\ \cdots & \cdots & \cdots \\ (n)^2 e^{-jn\omega_1} & (n)^1 e^{-jn\omega_1} & (n)^0 e^{-jn\omega_1} \\ \cdots & \cdots & \cdots \\ (N_h)^2 e^{-jN_h\omega_1} & (N_h)^1 e^{-jN_h\omega_1} & (N_h)^0 e^{-jN_h\omega_1} \end{pmatrix}$$

$$M_6 = \begin{pmatrix} (-N_h)^0 e^{-jN_h\omega_1} & (-N_h)^1 e^{-jN_h\omega_1} & (-N_h)^2 e^{-jN_h\omega_1} \\ \cdots & \cdots & \cdots \\ (-n)^0 e^{-jn\omega_1} & (-n)^1 e^{-jn\omega_1} & (-n)^2 e^{-jn\omega_1} \\ \cdots & \cdots & \cdots \\ 1 & 0 & 0 \\ \cdots & \cdots & \cdots \\ (n)^0 e^{jn\omega_1} & (n)^1 e^{jn\omega_1} & (n)^2 e^{jn\omega_1} \\ \cdots & \cdots & \cdots \\ (N_h)^0 e^{jN_h\omega_1} & (N_h)^1 e^{jN_h\omega_1} & (N_h)^2 e^{jN_h\omega_1} \end{pmatrix}$$

$$M_2 = \begin{pmatrix} (-N_h)^1 e^{jN_h 2\omega_1} & (-N_h)^0 e^{jN_h 2\omega_1} \\ \cdots & \cdots \\ (-n)^1 e^{jn 2\omega_1} & (-n)^0 e^{jn 2\omega_1} \\ \cdots & \cdots \\ 0 & 1 \\ \cdots & \cdots \\ (n)^1 e^{-jn 2\omega_1} & (n)^0 e^{-jn 2\omega_1} \\ \cdots & \cdots \\ (N_h)^1 e^{-jN_h 2\omega_1} & (N_h)^0 e^{-jN_h 2\omega_1} \end{pmatrix}$$

$$M_5 = \begin{pmatrix} (-N_h)^0 e^{-jN_h 2\omega_1} & (-N_h)^1 e^{-jN_h 2\omega_1} \\ \cdots & \cdots \\ (-n)^0 e^{-jn 2\omega_1} & (-n)^1 e^{-jn 2\omega_1} \\ \cdots & \cdots \\ 1 & 0 \\ \cdots & \cdots \\ (n)^0 e^{jn 2\omega_1} & (n)^1 e^{jn 2\omega_1} \\ \cdots & \cdots \\ (N_h)^0 e^{jN_h 2\omega_1} & (N_h)^1 e^{jN_h 3\omega_1} \end{pmatrix}$$

$$M_3 = \begin{pmatrix} (-N_h)^1 e^{jN_h 3\omega_1} & (-N_h)^0 e^{jN_h 3\omega_1} \\ \cdots & \cdots \\ (-n)^1 e^{jn 3\omega_1} & (-n)^0 e^{jn 3\omega_1} \\ \cdots & \cdots \\ 0 & 1 \\ \cdots & \cdots \\ (n)^1 e^{-jn 3\omega_1} & (n)^0 e^{-jn 3\omega_1} \\ \cdots & \cdots \\ (N_h)^1 e^{-jN_h 3\omega_1} & (N_h)^0 e^{-jN_h 3\omega_1} \end{pmatrix}$$

-continued $$M_4 = \begin{pmatrix} (-N_h)^0 e^{-jN_h 3\omega_1} & (-N_h)^1 e^{-jN_h 3\omega_1} \\ \cdots & \cdots \\ (-n)^0 e^{-jn3\omega_1} & (-n)^1 e^{-jn3\omega_1} \\ \cdots & \cdots \\ 1 & 0 \\ \cdots & \cdots \\ (n)^0 e^{jn3\omega_1} & (n)^1 e^{jn3\omega_1} \\ \cdots & \cdots \\ (N_h)^0 e^{jN_{h2}3\omega_1} & (N_h)^1 e^{jN_{h2}3\omega_1} \end{pmatrix}$$

where $\omega_1 = 2\pi f_0$.

Then, a weighted least squares method may be used to estimate the phasor $p_0$ in M. The best estimate of M may be given by $$\hat{M}_{WLS} = (B'W'WB)^{-1}B'W'WS$$

where W may be weights of the window, and Hanning widow may be used in this method. It should be noted that the other windows cam also be adopted, so the window may be not limited to the Hanning window.

Then the angle and magnitude can be calculated by $$\varphi_0(t)|_{t=0} = \angle p_0 \quad (6)$$

$$A_0(t)|_{t=0} = |p_0| \quad (7)$$

Because frequency may be derivative of angles, in order to estimate frequency, angles may be fitted to polynomial functions as shown below.

$$\varphi(i) = \varphi_{F0} + \varphi_{F1}\left(i - \frac{(N+1)}{2}\right) + \ldots + \varphi_{FK}\left(i - \frac{(N+1)}{2}\right)^K \quad (8)$$

where N may be the number of angles used to estimate frequency, and i=1, . . . , N. K may be the order of the polynomial. φ(i) (i=1, . . . , N) may be the angle estimated using Equation (6).

A least squares fitting method may be used to estimate the coefficients of polynomial $$\varphi_{coef} = (M_f'M_f)^{-1}M_f'\varphi \quad (9)$$

where $$\varphi_{coef} = [\varphi_{F0}, \varphi_{F1}, \ldots, \varphi_{FK}]'.$$

$M_f$ may be a N×(K+1) matrix, and $$M_f(i, j) = \left(i - \frac{(N+1)}{2}\right)^{(j-1)}$$

$(i = 1, \ldots, N, j = 1, \ldots K+1)$ $\varphi = [\varphi(1), \ldots, \varphi(N)]'$ Then, frequency can be derived using the coefficients of polynomial, as shown below.

$$f_F(i)|_{i=0} = \frac{f_0 N_{cyc}}{2\pi M_{samp}} \varphi_{F1} \quad (10)$$

$N_{cyc}$ may be the number of samples per fundamental cycle. $M_{samp}$ may be the number of samples slid by angle estimation window. In order to eliminate the effect of odd order harmonics on frequency estimation, a ½ fundamental cycle shift may be used in the method. Note that the number of samples slid between windows may be very important for frequency estimation under harmonics condition. A ½ fundamental cycle shift will not cause frequency estimation error under odd order harmonics condition.

As a length of phasor estimation window affects estimation accuracy, a longer estimation window has better accuracy under steady-state signal condition, but worse accuracy under dynamic conditions. The length of the window may vary to comply with the requirement of different applications. An exemplary window size of phasor estimation window may be a four fundamental frequency cycle. Additionally, the number of angles and the order of polynomial used for frequency estimation may affect the frequency estimation accuracy. Generally, a steady-state signal may be able to use more angles and low order polynomial, and dynamic signal may be able to use less angles and higher order polynomial. An exemplary of the parameters of the phasor estimation algorithm may be shown in Table 1 below.

TABLE 1

| $N_s$ | $N_{cyc}$ | $N_h$ | N | K | $M_{samp}$ |
|---|---|---|---|---|---|
| 15 | 24 | 48 | 9 | 2 | 12 |

Figure 5:
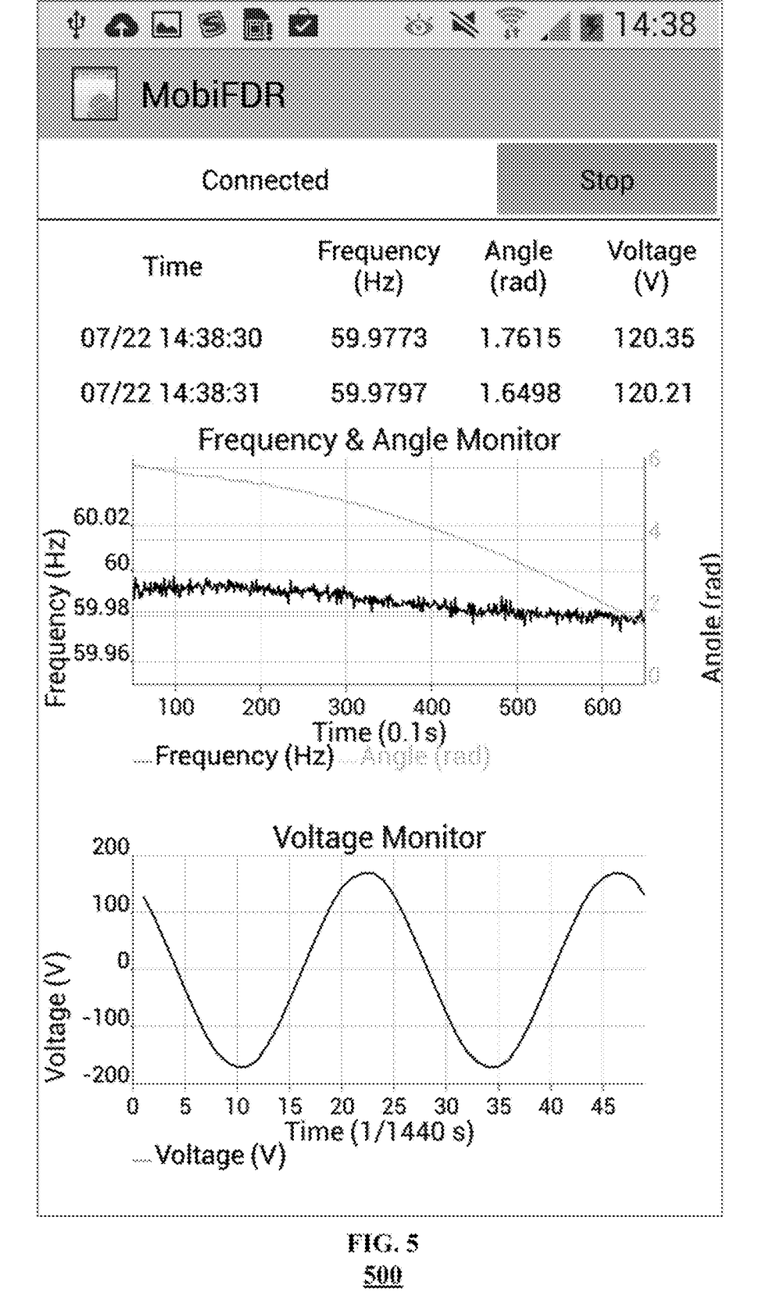
FIG. 5 illustrates a mobile user interface according to an embodiment of the present disclosure.

FIG. 5 illustrates a mobile user interface 500 for use on a mobile platform based PMU system 100 according to an embodiment of the present disclosure. According to an embodiment, phasor data may be visually displayed on a mobile device for better user interaction. Users may be able control the PMU system 100 and to display different phasor information such as signal magnitude, angle, and frequency, in real time, or alternatively retrieve historical data stored on PMU system 100 or on server 150.

Thus, the mobile platform wireless PMU system 100 may be much less costly and easier to setup and install than PMUs that use current transformers and potential transformers to measure phasor data by direct contact. More importantly, a significant feature of mobile platform wireless PMU may be portability. The unique features of mobile platform wireless PMU may be able to promote its quick and extensive deployment in larger-scale interconnected electric power system and/or distributed systems.

The mobile platform based wireless PMU and method therefore may be not limited to the specific embodiments described above, but includes variations, modifications, and equivalent embodiments defined by the following claims. The embodiment described above may be not necessarily in the alternative, as various embodiments may be combined to provide the desired characteristics.

It may be appreciated that the disclosure may be not limited to the described embodiments, and that any number of scenarios and embodiments in which conflicting appointments exist may be resolved.

Although the disclosure has been described with reference to several exemplary embodiments, it may be understood that the words that have been used may be words of description and illustration, rather than words of limitation. Changes may be made within the purview of the appended claims, as presently stated and as amended, without departing from the scope and spirit of the disclosure in its aspects. Although the disclosure has been described with reference to particular means and embodiments, the disclosure may be not intended to be limited to the particulars disclosed; rather the disclosure extends to all functionally equivalent structures, methods, and uses such as may be within the scope of the appended claims.

Although the present application describes specific embodiments which may be implemented as code segments in computer-readable media, it may be to be understood that dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof.

The illustrations of the embodiments described herein may be intended to provide a general understanding of the various embodiments. The illustrations may be not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations may be merely representational and may not be drawn to scale. Certain proportions within the illustrations may be exaggerated, while other proportions may be minimized. Accordingly, the disclosure and the figures may be to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure may be intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than may be expressly recited in each claim. Rather, as the following claims reflect, inventive subject matter may be directed to less than all of the features of any of the disclosed embodiments. Thus, the following claims may be incorporated into the Detailed Description, with each claim standing on its own as defining separately claimed subject matter.

The above disclosed subject matter may be to be considered illustrative, and not restrictive, and the appended claims may be intended to cover all such modifications, enhancements, and other embodiments which fall within the true spirit and scope of the present disclosure. Thus, to the maximum extent allowed by law, the scope of the present disclosure may be to be determined by the broadest permissible interpretation of the following claims and their equivalents, and shall not be restricted or limited by the foregoing detailed description.

What is claimed is:

1. A system comprising:
an electric field sensor to measure electric fields of an electric power grid, said electric field sensor includes a printed circuit board (PCB) with two conductive plates insulated from each other;
an analog to digital converter to generate digital output based upon measurements from the electrical field sensor;
an estimator to estimate phasor data of the electric power grid based upon the digital output, wherein the estimator comprises a mobile communication device to generate a global time stamp for each of the phasor data, and display the phasor data.

2. The system of claim 1, wherein the two conductive plates include two layers of parallel copper plates insulated from each other.

3. The system of claim 1, wherein the two conductive plates include two copper plates, each with a length of no less than 5.05 cm, a width of no less than 3.05 cm, or an area of no less than 15 cm2, or having a thickness of no less than 0.75 cm between the two copper plates.

4. The system of claim 1, further comprising an amplifier filter to amplify or filter the measurements from the electric field sensor to generate input signals to the analog to digital converter.

5. The system of claim 4, wherein the amplifier filter comprises multiple stages of amplifiers or filters.

6. The system of claim 1, wherein the analog to digital converter comprises a microcontroller to receive sampling trigger command to control the analog to digital converter, and to transmit digital output to the estimator.

7. The system of claim 1, wherein the estimator is to request a time coordinate from a server, calibrate a local time, calculate the global time stamp for each of the phasor data.

8. The system of claim 7, wherein the mobile communication device further stores or transmits the phasor data with corresponding global time stamp.

9. The system of claim 1, wherein the estimator executes a phasor estimation algorithm to filter digital output using digital filter and to compute phase angle and frequency.

10. The system of claim 9, wherein the phasor estimation algorithm comprises a digital filter with a digital averaging or band-pass filter, a phasor model with extended phasor model that models fundamental frequency component and second order harmonic components and third order harmonic components, linearization using quadratic polynomial for fundamental frequency component and linear polynomial to approximate the second order harmonic components and the third order harmonic components, estimation by fitting angles to quadratic polynomial using weighted least squares fitting method.

11. A method comprising:
measuring, by an electric field sensor, electric fields of electric power grid, said electric field sensor includes a printed circuit board (PCB) with two conductive plates insulated from each other;
generating, by an analog to digital converter, digital output based upon measurements from the electric field sensor;
estimating, by an estimator, phasor data of the electric power grid based upon the digital output wherein the estimator comprises a mobile communication device to generate a global time stamp for each of the phasor data and display the phasor data.

12. The method of claim 11, wherein the two conductive plates include two layers of parallel copper plates insulated from each other.

13. The method of claim 11, wherein the two conductive plates include two copper plates, each with a length of no less than 5.05 cm, a width of no less than 3.05 cm, or an area of no less than 15 cm2, or having a thickness of no less than 0.75 cm between the two copper plates.

14. The method of claim 11, further comprising an amplifier filter to amplify or filter the measurements from the electric field sensor to generate input signals to the analog to digital converter.

15. The method of claim 14, wherein the amplifier filter comprises multiple stages of amplifiers or filters.

16. The method of claim 11, wherein the analog to digital converter comprises a microcontroller to receive sampling trigger command to control the analog to digital converter, and to transmit digital output to the estimator.

17. The method of claim 11, wherein the mobile communication device is to request a time coordinate from a server, calibrate a local time, and calculate the global time stamp for each of the phasor data.

18. The method of claim 17, wherein the mobile communication device further stores or transmits the phasor data with corresponding global time stamp.

19. The method of claim 11, wherein the estimator executes a phasor estimation algorithm to filter digital output using digital filter and to compute phase angle and frequency.

20. The method of claim 19, wherein the phasor estimation algorithm comprises a digital filter with a digital averaging or band-pass filter, a phasor model with extended phasor model that models fundamental frequency component and second order harmonic components and third order harmonic components, linearization using quadratic polynomial for fundamental frequency component and linear polynomial to approximate the second order harmonic components and the third order harmonic components, estimation by fitting angles to quadratic polynomial using weighted least squares fitting method.

21. A system comprising:
an electric field sensor to measure electric fields of an electric power grid;
an analog to digital converter to generate digital output based upon measurements from the electrical field sensor;
an estimator to estimate phasor data of the electric power grid based upon the digital output, wherein the estimator comprises a mobile communication device to generate a global time stamp for each of the phasor data, and display the phasor data; and
an amplifier filter to amplify or filter the measurements from the electric field sensor to generate input signals to the analog to digital converter.

22. The system of claim 21, wherein the electric field sensor includes a printed circuit board (PCB) with two layers of parallel copper plates insulated from each other.

23. The system of claim 21, wherein the electric field sensor includes a printed circuit board (PCB) having two copper plates, each with a length of no less than 5.05 cm, a width of no less than 3.05 cm, or an area of no less than 15 cm2, or having a thickness of no less than 0.75 cm between the two copper plates.

24. The system of claim 21, wherein the amplifier filter comprises multiple stages of amplifiers or filters.

25. The system of claim 21, wherein the analog to digital converter comprises a microcontroller to receive sampling trigger command to control the analog to digital converter, and to transmit digital output to the estimator.

26. The system of claim 21, wherein the estimator is to request a time coordinate from a server, calibrate a local time, calculate the global time stamp for each of the phasor data.

27. The system of claim 26, wherein the mobile communication device further stores or transmits the phasor data with corresponding global time stamp.

28. The system of claim 21, wherein the estimator executes a phasor estimation algorithm to filter digital output using digital filter and to compute phase angle and frequency.

29. The system of claim 28, wherein the phasor estimation algorithm comprises a digital filter with a digital averaging or band-pass filter, a phasor model with extended phasor model that models fundamental frequency component and second order harmonic components and third order harmonic components, linearization using quadratic polynomial for fundamental frequency component and linear polynomial to approximate the second order harmonic components and the third order harmonic components, estimation by fitting angles to quadratic polynomial using weighted least squares fitting method.

30. A method comprising:
measuring, by an electric field sensor, electric fields of electric power grid;
generating, by an analog to digital converter, digital output based upon measurements from the electric field sensor;
estimating, by an estimator, phasor data of the electric power grid based upon the digital output wherein the estimator comprises a mobile communication device to generate a global time stamp for each of the phasor data and display the phasor data; and
amplifying or filtering with an amplifier filter the measurements from the electric field sensor to generate input signals to the analog to digital converter.

31. The method of claim 30, wherein the electric field sensor includes a printed circuit board (PCB) with two layers of parallel copper plates insulated from each other.

32. The method of claim 30, wherein the electric field sensor includes a printed circuit board (PCB) having two copper plates, each with a length of no less than 5.05 cm, a width of no less than 3.05 cm, or an area of no less than 15 cm2, or having a thickness of no less than 0.75 cm between the two copper plates.

33. The method of claim 30, wherein the amplifier filter comprises multiple stages of amplifiers or filters.

34. The method of claim 30, wherein the analog to digital converter comprises a microcontroller to receive sampling trigger command to control the analog to digital converter, and to transmit digital output to the estimator.

35. The method of claim 30, wherein the mobile communication device is to request a time coordinate from a server, calibrate a local time, and calculate the global time stamp for each of the phasor data.

36. The method of claim 35, wherein the mobile communication device further stores or transmits the phasor data with corresponding global time stamp.

37. The method of claim 30, wherein the estimator executes a phasor estimation algorithm to filter digital output using digital filter and to compute phase angle and frequency.

38. The method of claim 37, wherein the phasor estimation algorithm comprises a digital filter with a digital averaging or band-pass filter, a phasor model with extended phasor model that models fundamental frequency component and second order harmonic components and third order harmonic components, linearization using quadratic polynomial for fundamental frequency component and linear polynomial to approximate the second order harmonic components and the third order harmonic components, estimation by fitting angles to quadratic polynomial using weighted least squares fitting method.

* * * * *